US010121727B1

(12) United States Patent
Lucas et al.

(10) Patent No.: US 10,121,727 B1
(45) Date of Patent: Nov. 6, 2018

(54) APPARATUS, SYSTEM, AND METHOD FOR IMPROVING THE THERMAL CONDUCTION OF HEAT SINKS

(71) Applicant: Juniper Networks, Inc., Sunnyvale, CA (US)

(72) Inventors: Michael E. Lucas, Cupertino, CA (US); Nikola Ikonomov, Millbrae, CA (US); John I. Kull, Redwood City, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/681,333

(22) Filed: Aug. 18, 2017

(51) Int. Cl.
| H01L 23/00 | (2006.01) |
| H01L 23/40 | (2006.01) |
| H05K 7/20 | (2006.01) |
| G02B 6/42 | (2006.01) |

(52) U.S. Cl.
CPC ............ *H01L 23/40* (2013.01); *G02B 6/4269* (2013.01); *H05K 7/2039* (2013.01); *H05K 7/20418* (2013.01); *H01L 2023/405* (2013.01); *H01L 2023/4018* (2013.01); *H01L 2023/4087* (2013.01); *H05K 2201/10121* (2013.01)

(58) Field of Classification Search
CPC ............ G02B 6/4269; H05K 7/20418; H05K 7/2039; H05K 2201/10121; H01L 23/40; H01L 2023/4087; H01L 2023/4018; H01L 2023/405
See application file for complete search history.

(56) References Cited

U.S. PATENT DOCUMENTS

2011/0110048 A1* 5/2011 Lima ................ H05K 7/20418
361/720

OTHER PUBLICATIONS

Susheela Nanjunda Rao Narasimhan et al.; Apparatus, System, and Method for Decreasing Heat Migration in Ganged Heatsinks; U.S. Appl. No. 15/144,612, filed May 2, 2016.
Learn About Torsion Springs; http://www.leespring.com/int_learn_torsion.asp; Sep. 10, 2004.
Wikipedia; Heat Pipe; https://en.wikipedia.org/wiki/Heat_pipe; May 10, 2004.
Wikipedia; Bellows; https://en.wikipedia.org/wiki/Bellows; Jul. 31, 2004.

* cited by examiner

*Primary Examiner* — Dimary Lopez Cruz
*Assistant Examiner* — Zhengfu Feng
(74) *Attorney, Agent, or Firm* — FisherBroyles, LLP

(57) ABSTRACT

The disclosed apparatus may include (1) a cage designed to hold an optical module, (2) a ramp that is secured to the cage and supports a heat sink such that the heat sink is capable of moving along the ramp, and (3) at least one spring having one end coupled to the ramp and another end coupled to the heat sink, wherein (A) prior to insertion of the optical module into the cage, the spring exerts a force at least partially directed along an axis of insertion of the optical module and (B) insertion of the optical module into the cage moves the heat sink along the ramp such that the force exerted by the spring (I) rotates away from the axis of insertion and (II) presses the heat sink against a surface of the optical module. Various other apparatuses, systems, and methods are disclosed.

20 Claims, 8 Drawing Sheets

APPARATUS, SYSTEM, AND METHOD FOR IMPROVING THE THERMAL CONDUCTION OF HEAT SINKS

BACKGROUND

Heat sinks are often a critical component of electronic devices. For example, power dissipated by an electronic device may generate heat, thereby causing the operating temperature of the device to rise. If the operating temperature increases above a certain level, components of the device may overheat, malfunction, or even break. As such, many electronic devices may be equipped with heat sinks designed to transfer and/or dissipate heat. In general, a heat sink may contain and/or represent a thermally conductive material that transfers heat away from an operational device, thereby cooling the device and/or enabling the device to achieve optimal performance.

Unfortunately, traditional heat sink and/or heat transfer systems may be unable to effectively and/or efficiently dissipate heat generated by some electronic devices. For example, some optical modules (e.g., Quad Small Form-factor Pluggable (QSFP) transceivers or similar communications devices) may generate more heat than conventional heat sink technologies are able to adequately dissipate (e.g., due to increased power consumption and/or increased density of these modules within network devices). Furthermore, the design of some optical module enclosures may be incompatible with and/or unable to accommodate efficient thermal interface materials that would enable greater heat dissipation via heat sinks.

The instant disclosure, therefore, identifies and addresses a need for additional apparatuses, systems, and methods for improving the thermal conduction of heat sinks.

SUMMARY

As will be described in greater detail below, the instant disclosure generally relates to apparatuses, systems, and methods for improving the thermal conduction of heat sinks. In one example, an apparatus for accomplishing such a task may include (1) a cage designed to hold an optical module, (2) a ramp that is secured to the cage and supports a heat sink such that the heat sink is capable of moving along the ramp, and (3) at least one spring having one end coupled to the ramp and another end coupled to the heat sink, wherein (A) prior to insertion of the optical module into the cage, the spring exerts a force at least partially directed along an axis of insertion of the optical module and (B) insertion of the optical module into the cage moves the heat sink along the ramp such that the force exerted by the spring (I) rotates away from the axis of insertion and (II) presses the heat sink against a surface of the optical module.

Similarly, a heat transfer system incorporating the above-described apparatus may include (1) a cage designed to hold an optical module, (2) a ramp that is secured to the cage and supports a heat sink such that the heat sink is capable of moving along the ramp, and (3) at least one spring having one end coupled to the ramp and another end coupled to the heat sink, wherein (A) prior to insertion of the optical module into the cage, the spring exerts a force at least partially directed along an axis of insertion of the optical module and (B) insertion of the optical module into the cage moves the heat sink along the ramp such that the force exerted by the spring (I) rotates away from the axis of insertion and (II) presses the heat sink against a surface of the optical module.

A corresponding method may include (1) securing, to a cage designed to hold an optical module, a ramp that supports a heat sink such that the heat sink is capable of moving along the ramp, (2) coupling one end of a spring to the ramp and another end of the spring to the heat sink such that prior to insertion of the optical module into the cage, the spring exerts a force at least partially directed along an axis of insertion of the optical module, and (3) inserting the optical module into the cage such that (A) the heat sink moves along the ramp, (B) the force exerted by the spring rotates away from the axis of insertion, and (C) the heat sink presses against a surface of the optical module.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
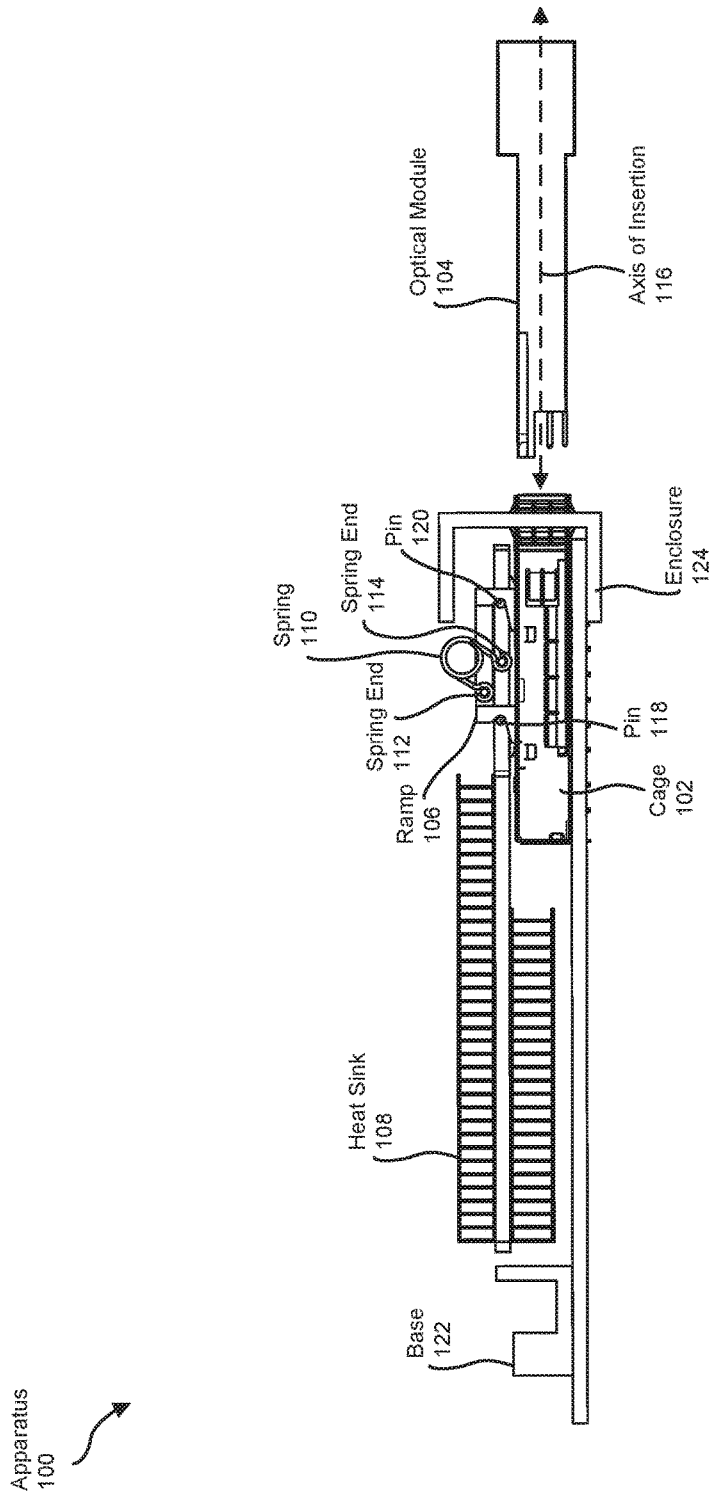
FIG. 1 is an illustration of an exemplary apparatus for improving the thermal conduction of heat sinks.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for improving the thermal conduction of heat sinks. As will be explained in greater detail below, embodiments of the instant disclosure may increase the force with which a heat sink is coupled to and/or pressed against an optical module. For example, these embodiments may secure a heat sink against an optical module with a higher force (e.g., 2 pounds or greater) than traditional heat transfer systems. As such, these embodiments may more effectively and/or efficiently dissipate heat generated by optical modules, thereby increasing and/or optimizing the performance of these modules. Furthermore, embodiments of the instant disclosure may be incorporated into existing and/or traditional designs for optical modules and/or optical module enclosures. These embodiments may therefore improve the functioning of such technologies without adjustments or modifications to their design.

In one example, embodiments of the instant disclosure may progressively increase the force that a heat sink exerts on an optical module as the optical module is inserted into a cage. For example, these embodiments may couple the heat sink to the cage using a ramp and spring assembly. As the optical module is inserted into the cage, the optical module may move the heat sink down the ramp (e.g., by pushing a blade extending from the heat sink). This movement may rotate one end of the spring, causing the force exerted by the spring to both increase in magnitude and rotate towards the interface between the heat sink and the optical module. As a result, when the optical module is fully inserted into the cage, the force exerted by the spring may press the heat sink against the optical module, thereby enabling the heat sink to efficiently transfer heat away from the optical module. In addition, the force exerted by the spring when the optical module is fully inserted may be directed at an angle that secures the optical module within the cage. The disclosed embodiments may therefore ensure that the optical module is not inadvertently and/or accidentally ejected from the cage during operation.

The following will provide, with reference to FIGS. 1-5 and 7, detailed descriptions of exemplary apparatuses and corresponding implementations that improve the thermal conduction of heat sinks. Detailed descriptions of exemplary heat pipes containing flexible bellows will be provided in connection with FIG. 6. Detailed descriptions of exemplary methods for improving the thermal conduction of heat sinks will also be provided in connection with FIG. 8.

FIG. 1 shows an exemplary apparatus 100 for improving the thermal conduction of heat sinks. As illustrated in FIG. 1, apparatus 100 may include a cage 102. Cage 102 generally represents any type or form of enclosure, housing, or structure designed to hold, support, and/or secure a device that dissipates power and/or generates heat. In one example, cage 102 may be designed to hold an optical module 104. Optical module 104 generally represents any type or form of electronic, network, and/or communications device. In one embodiment, optical module 104 may represent QSFP transceiver or similar communications module. As shown in FIG. 1, optical module 104 may be inserted into cage 102 along an axis of insertion 116.

In the example of FIG. 1, cage 102 may be housed and/or contained within an enclosure 124. Enclosure 124 generally represents all or a portion of an interface card, network device, Printed Circuit Board (PCB), and/or additional circuit or circuit component that houses and/or operates one or more optical modules.

As shown in FIG. 1, apparatus 100 may also include a heat sink 108. The term "heat sink," as used herein, generally refers to any type or form of system, device, structure, and/or mechanism that conducts, transfers, absorbs, and/or sinks heat. Heat sinks may include and/or contain a variety of materials. Examples of such heat sink materials include, without limitation, copper, aluminum, diamond, alloys of one or more of the same, combinations or variations of one or more of the same, and/or any other suitable materials.

In the example of FIG. 1, heat sink 108 may be designed to dissipate heat generated by optical module 104 when optical module 104 is inserted into cage 102. For example, heat sink 108 may be coupled to cage 102 in a manner that results in physical contact between heat sink 108 and optical module 104 when optical module 104 is fully and/or partially inserted into cage 102. As shown in FIG. 1, heat sink 108 may be coupled to cage 102 via a ramp 106. Ramp 106 generally represents any type or form of structure or assembly that supports heat sink 108 and/or enables movement of heat sink 108. In one embodiment, heat sink 108 may move along ramp 106 via one or more pins extending from at least one side of heat sink 108 (e.g., pins 118 and 120 in FIG. 1). In the example of FIG. 1, heat sink 108 may be entirely supported by ramp 106. In other words, heat sink 108 may be separated from and/or not attached to other components of apparatus 100, including enclosure 124 and a base 122.

In some examples, ramp 106 may be secured and/or attached to cage 102 (e.g., via screws, pins, adhesive bonds, etc.). In these examples, the surface of cage 102 to which ramp 106 is secured may contain a hole or opening that enables contact between heat sink 108 and optical module 104 when optical module 104 is inserted into cage 102.

In one example, heat sink 108 may be coupled to ramp 106 via a spring 110. The term "spring," as used herein, generally refers to any type or form of elastic object or device that stores mechanical energy. In some embodiments, a spring may exert a force when compressed, stretched, rotated, and/or otherwise displaced from its resting position. In one example, spring 110 may represent a torsion spring. In general, a torsion spring may represent any spring that exerts a torque or rotary force. Additional examples of spring 110 include, without limitation, compression springs, tension springs, variable springs, coil springs, and/or flat springs.

As shown in FIG. 1, a spring end 112 of spring 110 may be secured to ramp 106. In one example, spring end 114 of spring 110 may also be secured to heat sink 108. Because, in this example, ramp 106 is attached to cage 102, spring end 112 may be immobile (e.g., with respect to the components of apparatus 100). However, because heat sink 108 may move along ramp 106, spring end 114 may move (e.g., rotate) as a result of the movement of heat sink 108. As will be explained in greater detail below, the movement of spring end 114 may cause the force exerted by spring 110 to change in magnitude and/or direction.

Figure 2:
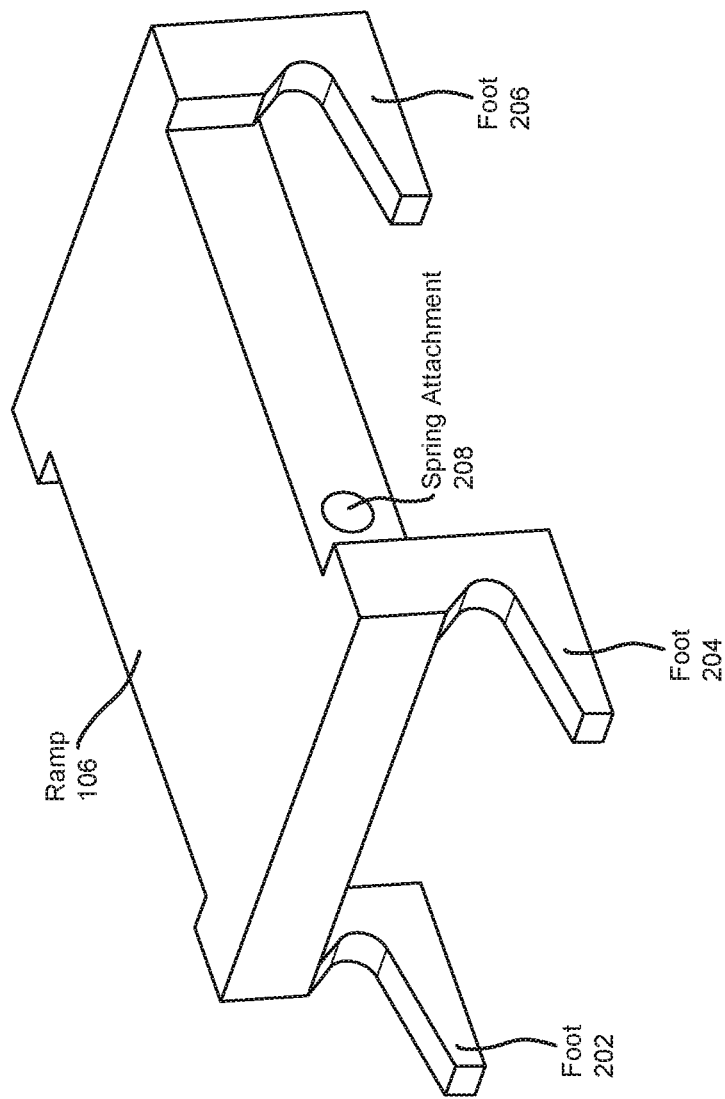
FIG. 2 is an illustration of an exemplary component of an apparatus for improving the thermal conduction of heat sinks.

FIG. 2 illustrates an exemplary embodiment of ramp 106. As shown in FIG. 2, ramp 106 may include one or more feet, such as a foot 202, a foot 204, and a foot 206. Although not shown in FIG. 2, ramp 106 may include a corresponding fourth foot. These feet may be designed to support heat sink 108 and/or enable movement of heat sink 108. In some examples, heat sink 108 may move along one or more of foot 202, foot 204, and foot 206 via pin 118, pin 120, and/or any additional pins not illustrated within FIG. 1. In some embodiments, spring end 112 of spring 110 may be secured to ramp 106 via a spring attachment 208.

Spring attachment 208 generally represents any type or form of pin, screw, and/or adhesive bond that secures spring end 112 to ramp 106. In some examples, apparatus 100 may include an additional instance of spring 110 positioned on the opposite side of ramp 106 (i.e., the side of ramp 106 not shown in FIGS. 1 and 2). One or more instances of spring 110 may be coupled to ramp 106 in any additional manner or position, such as underneath or on top of ramp 106.

Figure 3:
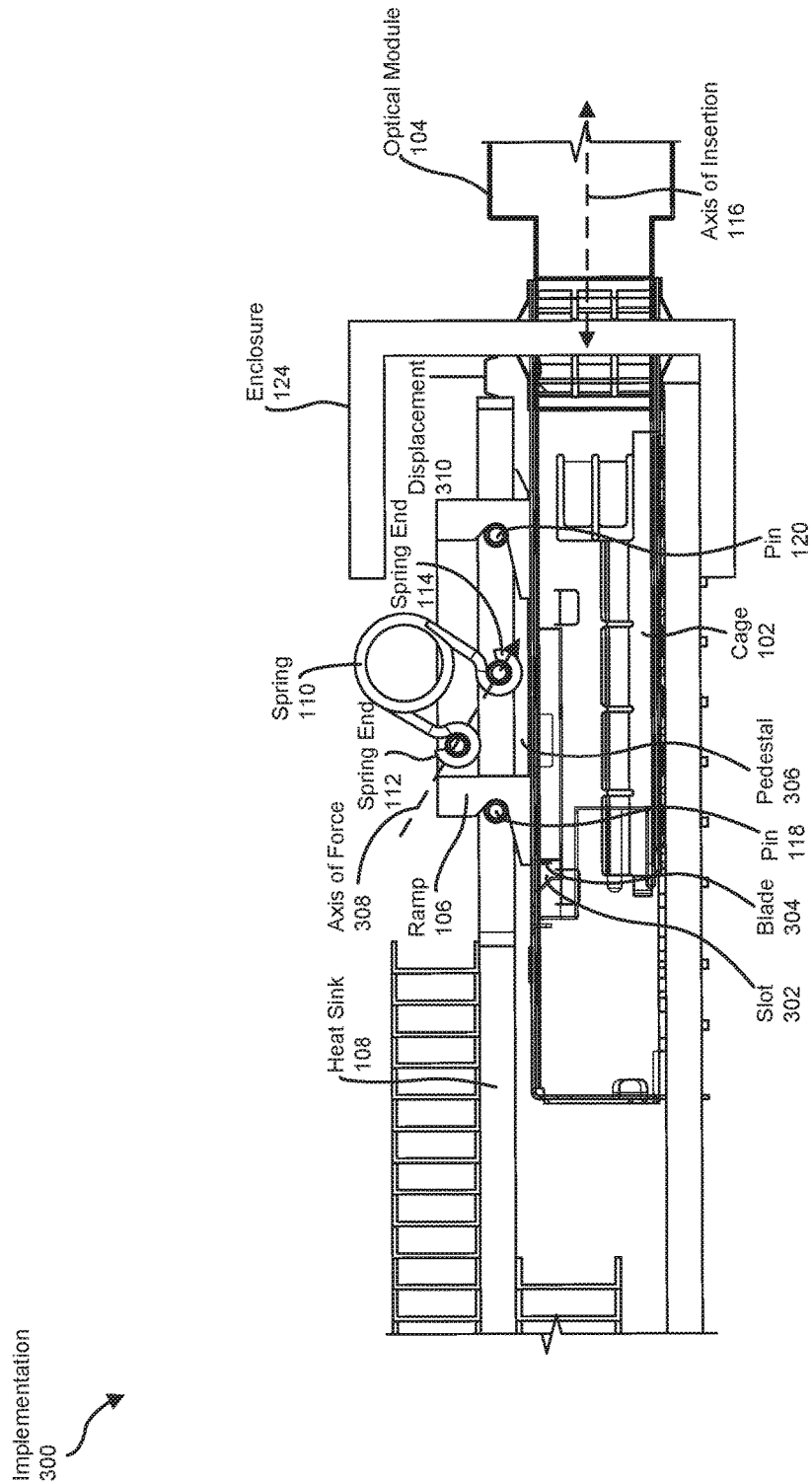
FIG. 3 is an illustration of an exemplary implementation of an apparatus for improving the thermal conduction of heat sinks.
Figure 4:
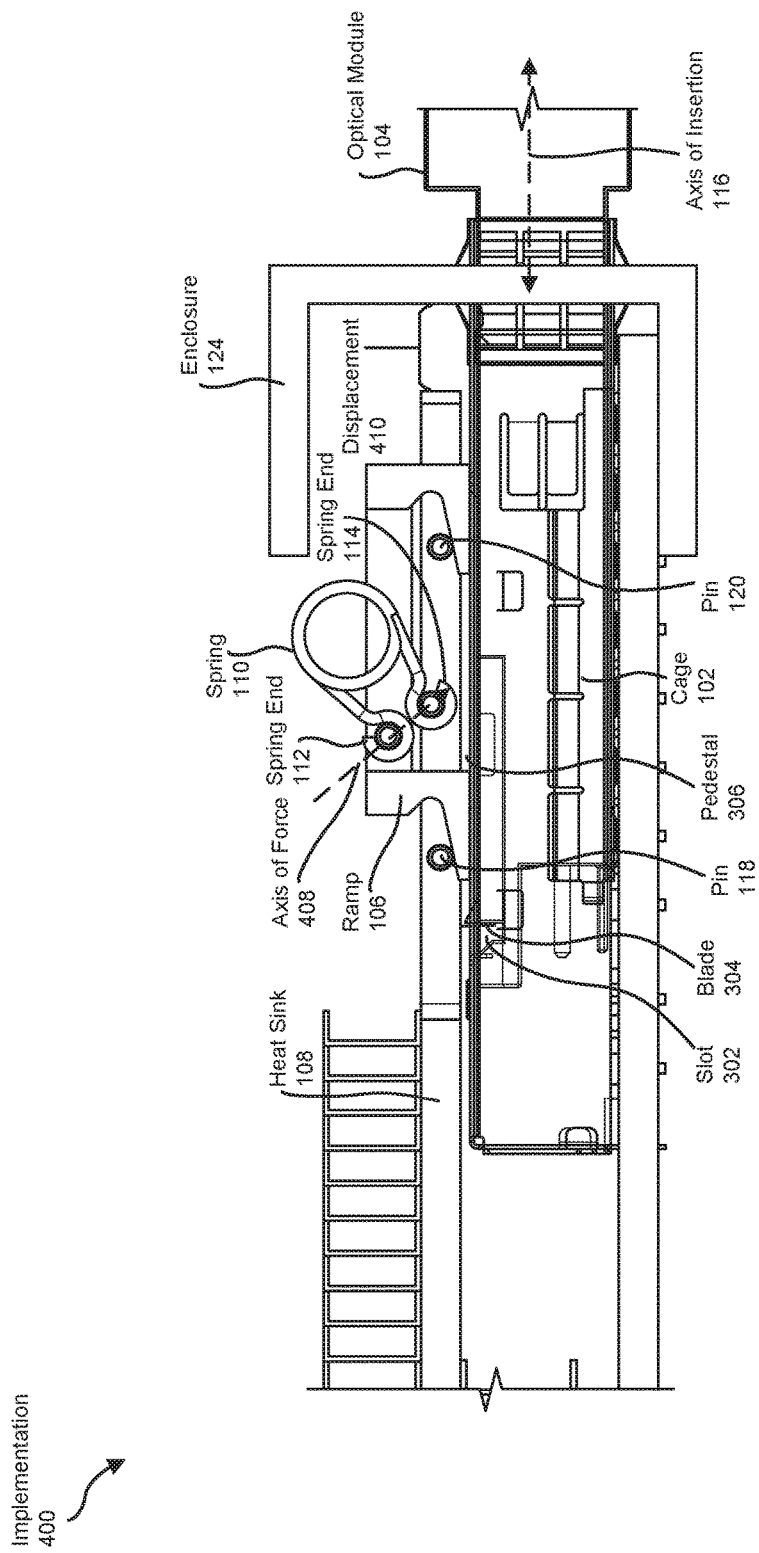
FIG. 4 is an illustration of an additional exemplary implementation of an apparatus for improving the thermal conduction of heat sinks.
Figure 5:
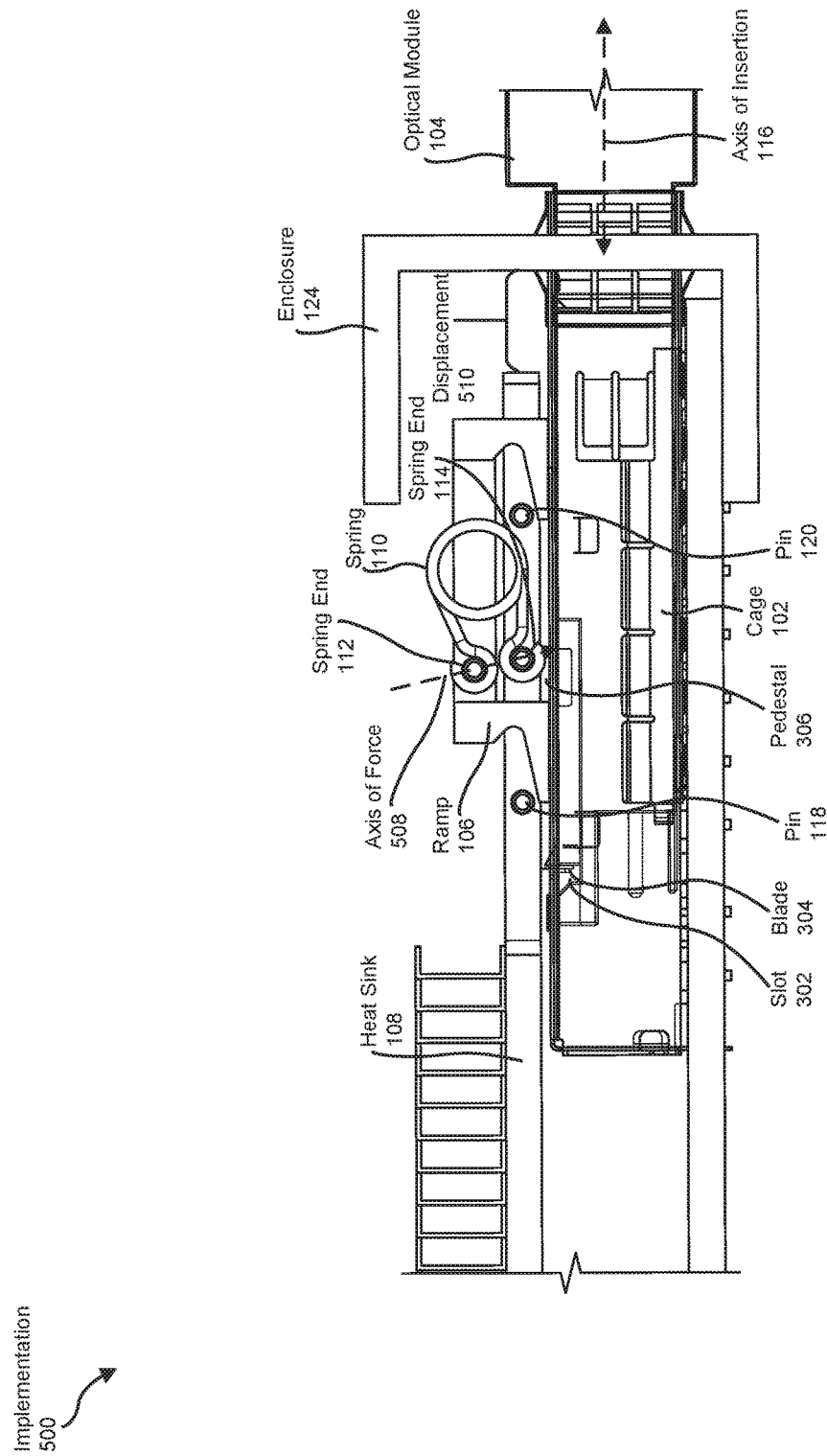
FIG. 5 is an illustration of an additional exemplary implementation of an apparatus for improving the thermal conduction of heat sinks.

FIGS. 3-5 illustrate exemplary implementations of apparatus 100 that correspond to various stages of the process of inserting optical module 104 into cage 102. For example, implementation 300 in FIG. 3 illustrates the configuration and/or state of one or more components of apparatus 100 when optical module 104 has been partially inserted into cage 102. The term "partially inserted," as used herein, generally refers to any state of optical module 104 in which optical module 104 has entered cage 102 but has not yet reached its intended resting position within cage 102.

As shown in FIG. 3, heat sink 108 may include a pedestal 306. Pedestal 306 generally represents any type or form of surface, platform, and/or area of heat sink 108 that makes physical contact with optical module 104 (e.g., via an opening within cage 102). In some embodiments, pedestal 306 may represent and/or be composed of a thermal interface material that facilitates efficient heat transfer between optical module 104 and heat sink 108. As shown in FIG. 3, heat sink 108 may also include a blade 304 that is attached to and/or protrudes from pedestal 306. In the example of FIG. 3, blade 304 may extend into the opening of cage 102. In this example, optical module 104 may contain a slot 302 designed to catch and/or hold blade 304. In other examples, optical module 104 may include any additional or alternative surface, opening, and/or latch that makes contact with blade 304.

FIG. 3 illustrates the state of apparatus 100 when optical module 104 has been inserted into cage 102 up to a point at which optical module 104 has just made contact with blade 304. In this state, the other components of apparatus 100 may not yet have been altered or moved. For example, the direction and/or magnitude of the force exerted by spring 110 at this point of insertion may match the direction and/or magnitude of the force exerted by spring 110 when optical module 104 is completely removed from cage 102. As shown in FIG. 3, the force exerted by spring 110 in this configuration may be directed along an axis of force 308. In this example, axis of force 308 may represent an angle rotated approximately 45' relative to axis of insertion 116. In general, axis of force 308 may represent any angle at least partially parallel (i.e., not perpendicular) to axis of insertion 116.

In addition, at the point of insertion described by implementation 300, heat sink 108 may not yet have moved along ramp 106. For example, FIG. 3 shows pins 118 and 120 at their resting position against the feet of ramp 106. In addition, the distance between heat sink 108 and enclosure 124 (described by a displacement 310 in FIG. 3) may match the distance between these components when optical module 104 is completely removed from cage 102. Moreover, at this point of insertion, pedestal 306 may not yet have made contact with the top of optical module 104.

FIG. 4 illustrates an exemplary implementation 400 of apparatus 100. In this example, implementation 400 may represent a subsequent stage of inserting optical module 104 into cage 102. Specifically, implementation 400 may represent the configuration and/or state of one or more components of apparatus 100 when optical module 104 has been inserted farther into cage 102 than the state of insertion illustrated by implementation 300. However, implementation 400 may still represent the configuration and/or state of those components before optical module 104 has been fully inserted.

During insertion of optical module 104, once blade 304 of heat sink 108 makes contact with slot 302 of optical module 104 (as shown in FIG. 3), heat sink 108 may move with optical module 104 as optical module 104 continues to be inserted into cage 102. For example, the force exerted on blade 304 by optical module 104 may cause heat sink 108 to move along ramp 106. This displacement of heat sink 108 may be illustrated in FIG. 4 by the displacement of pins 118 and 120 along the feet of ramp 106. FIG. 4 also illustrates a corresponding displacement of heat sink 108 relative to enclosure 124 (described by a displacement 410). In the examples of FIGS. 3 and 4, displacement 410 may be greater than displacement 310.

The movement of heat sink 108 may also cause movement of spring end 114 relative to spring end 112. Specifically, spring end 114 may rotate towards and/or move closer to spring end 112. In some examples, this movement of spring end 114 may change the direction of the force exerted by spring 110. For example, this movement may cause the direction of the force exerted by spring 110 (represented by an axis of force 408 in FIG. 4) to rotate farther away from axis of insertion 116. In the example of FIG. 4, axis of force 408 may represent an angle rotated approximately 60° relative to axis of insertion 116.

In some embodiments, pedestal 306 may begin to make contact with optical module 104 as apparatus 100 transitions from the configuration illustrated by implementation 300 to the configuration illustrated by implementation 400. For example, as the force exerted by spring 110 rotates away from axis of insertion 116, this force may begin to press pedestal 306 closer towards and/or more strongly against optical module 104. In some examples, this force may increase in magnitude (e.g., due to the reduced distance between spring end 112 and spring end 114). Once pedestal 306 makes contact with the surface of optical module 104, pedestal 306 and optical module 104 may continue to move together due at least in part to friction between these components. For example, pedestal 306 and/or optical module 104 may be designed such that the coefficient of friction between these components facilitates the movement of pedestal 306 as optical module 104 is inserted into and/or extracted from cage 102.

FIG. 5 illustrates an exemplary implementation 500 of apparatus 100. In this example, implementation 500 may represent the configuration and/or state of one or more components of apparatus 100 when optical module 104 has been fully inserted into cage 102. At this stage of insertion, heat sink 108 may have traveled its maximum intended distance along ramp 106. For example, as illustrated in FIG. 5, pins 118 and 120 may no longer be supported by ramp 106. In addition, a displacement 510 (i.e., the distance between heat sink 108 and enclosure 124 in FIG. 5) may be greater than both displacement 310 and displacement 410.

Implementation 500 may also show that spring end 114 has continued to rotate farther towards spring end 112 (e.g., compared to the position of spring end 114 within implementation 400). As shown in FIG. 5, when optical module 104 is fully inserted into cage 102, spring end 114 may be directly (or almost directly) underneath spring end 112. Accordingly, the direction of the force exerted by spring 110 in this position (described by an axis of force 508) may be perpendicular (or almost perpendicular) to axis of insertion 116. In the example of FIG. 5, axis of force 508 may represent an angle rotated approximately 80° relative to axis of insertion 116. As such, when optical module 104 is fully inserted into cage 102, the majority of the force exerted by spring 110 may be directed in a manner that presses pedestal 306 against the surface of optical module 104. In addition, the direction of this force may secure optical module 104 within cage 102 (e.g., rather than working to expel optical module 104 from cage 102).

In some examples, the force exerted by spring 110 when optical module 104 is fully inserted into cage 102 may enable pedestal 306 to effectively and/or efficiently transfer heat away from optical module 104. For example, the magnitude of the force exerted by spring 110 may provide secure and/or sufficient contact between pedestal 306 and optical module 104, thereby facilitating efficient heat dissipation by heat sink 108. In some embodiments, the pressure between pedestal 306 and optical module 104 produced by spring 110 may be higher than the pressure produced by traditional heat sink systems. For example, the force exerted by spring 110 may result in a pressure of 12 pounds per square inch or greater between optical module 104 and pedestal 306. As such, the disclosed embodiments may provide improved heat dissipation for optical modules, thereby increasing and/or optimizing the performance of these modules.

In some embodiment, the process of extracting optical module 104 from cage 102 may generally mirror and/or reverse the process of inserting optical module 104. For example, while optical module 104 is being removed from cage 102, friction between optical module 104 and pedestal 306 may cause heat sink 108 to move up ramp 106. As heat sink 108 moves up ramp 106, spring end 114 may move and/or rotate away from spring end 112. As such, the force exerted by spring 110 may change in both magnitude and direction. Specifically, the magnitude of the force may decrease, while the direction of the force may rotate back towards axis of insertion 116. Once optical module 104 has been fully extracted from cage 102, the components of apparatus 100 may generally be in the same configuration as the configuration illustrated in FIG. 1.

Some embodiments of the instant disclosure may incorporate one or more heat pipes into apparatus 100. The term "heat pipe," as used herein, generally refers to any device, assembly, and/or structure that transfers heat between two interfaces. As with a heat sink, a heat pipe may contain and/or be at least partially composed of one or more thermally conductive materials (e.g., metals). A heat pipe may also contain a liquid that is transformed into a vapor as a result of heat transfer between the heat pipe and a heat-generating device. In some examples, this vapor may travel along an internal structure (e.g., a tube or tunnel) of the heat pipe. At the end of the structure (which may contain and/or be coupled to a heat sink), the vapor may condense and then return to the beginning of the heat pipe via a system known as a wick. A wick system may transfer condensed liquid to the heat-receiving end of a heat pipe via any suitable method, such as capillary action, centrifugal force, and/or gravity.

In some embodiments, apparatus 100 may include a heat pipe that contains and/or represents a flexible bellows. The term "bellows," as used herein, generally refers to any object, structure, or shape capable of lateral and/or axial expansion and contraction. In some examples, a bellows may contain and/or be composed of a series of flexible convolutions and/or folds that individually expand and contract to facilitate movement of the bellows.

Figure 6:
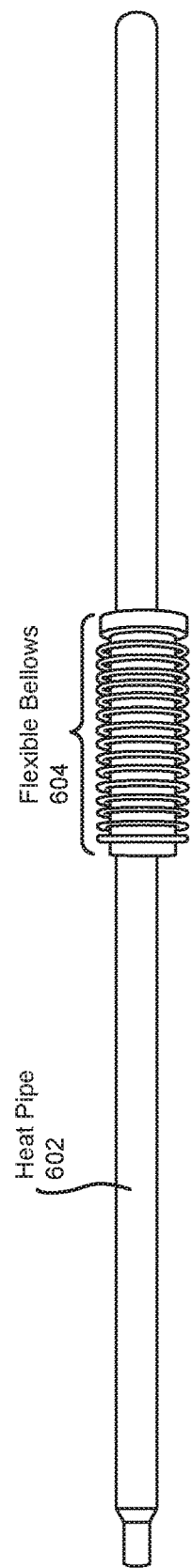
FIG. 6 is an illustration of an exemplary heat pipe containing a flexible bellows.

As an example, FIG. 6 illustrates a heat pipe 602 that contains a flexible bellows 604. Flexible bellows 604 may expand and contract in response to a variety of stimuli, such as in response to force being applied to one or both ends of heat pipe 602 and/or in response to heat being transferred along heat pipe 602. In addition, flexible bellows 604 may be composed of any type or form of material that allows and/or facilitates changes in the length of flexible bellows 604. In one embodiment, flexible bellows 604 may be composed of phosphor bronze or a similar alloy. Furthermore, flexible bellows 604 may contain any number of flexible convolutions. In some examples, flexible bellows 604 may also contain an internal wick system that facilitates heat transfer within heat pipe 602. This internal wick system may expand and/or contract to account for changes in the length and/or diameter of flexible bellows 604.

Figure 7:
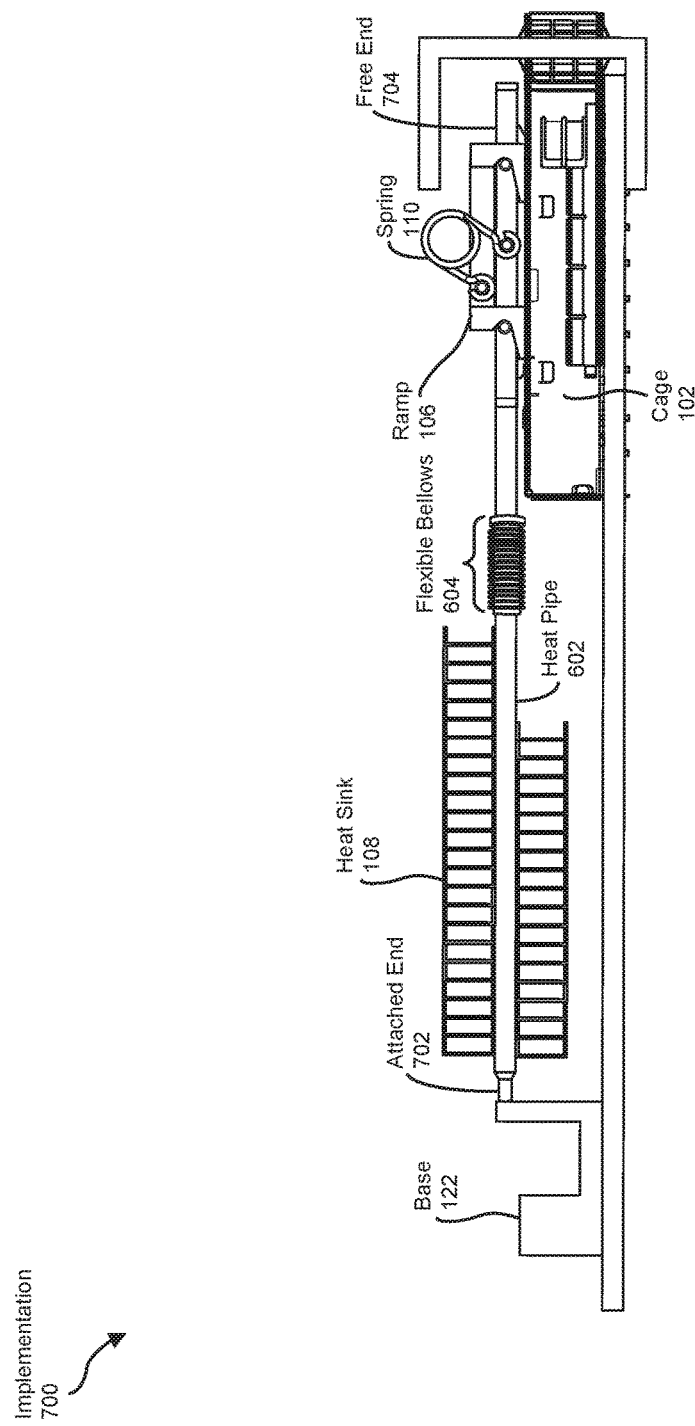
FIG. 7 is an illustration of an exemplary apparatus for improving the thermal conduction of heat sinks that includes a heat pipe containing a flexible bellows.

FIG. 7 illustrates an exemplary implementation 700 that shows how heat pipe 602 may be incorporated into apparatus 100. In this example, one or more instances of heat pipe 602 may be coupled to and/or inserted into heat sink 108. As shown in FIG. 7, flexible bellows 604 of heat pipe 602 may be inserted into the middle of heat sink 108 (e.g., between the portion of heat sink 108 that interacts with ramp 106 and the portion of heat sink 108 containing metal ridges that dissipate heat). In this example, the portion of heat pipe 602 not composed of flexible bellows 604 may be connected to and/or merged with heat sink 108. Heat pipe 602 and/or flexible bellows 604 may be inserted into and/or coupled to heat sink 108 in any additional or alternative manner or position.

In the example of FIG. 7, heat sink 108 may be secured and/or attached to base 122 of enclosure 124. Notably, this configuration may differ from the configuration of heat sink 108 illustrated in FIGS. 1 and 3-5, which show heat sink 108 as being unattached from base 122 and enclosure 124. In the example of FIG. 7, an attached end 702 of heat sink 108 may be secured to base 122. As such, flexible bellows 604 may contract and/or expand to account for the movement of a free end 704 of heat sink 108. For example, as optical module 104 is inserted into cage 102 and free end 704 moves down ramp 106, the length of flexible bellows 604 may contract with a displacement equal to the displacement of free end 704. When optical module 104 is removed from cage 102, flexible bellows 604 may expand as free end 704 moves up ramp 106.

In some embodiments, incorporating a heat pipe such as heat pipe 602 into heat sink 108 may increase the efficiency and/or amount of heat dissipated by apparatus 100. For example, adding heat pipe 602 to apparatus 100 may improve the overall ability of apparatus 100 to dissipate heat. In addition, incorporating flexible bellows 604 into heat sink 108 may enable heat sink 108 to be secured to enclosure 124. Securing heat sink 108 to enclosure 124 may provide various advantages for apparatus 100, such as increasing the stability of heat sink 108 and/or increasing the capability of heat sink 108 to dissipate heat.

Figure 8:
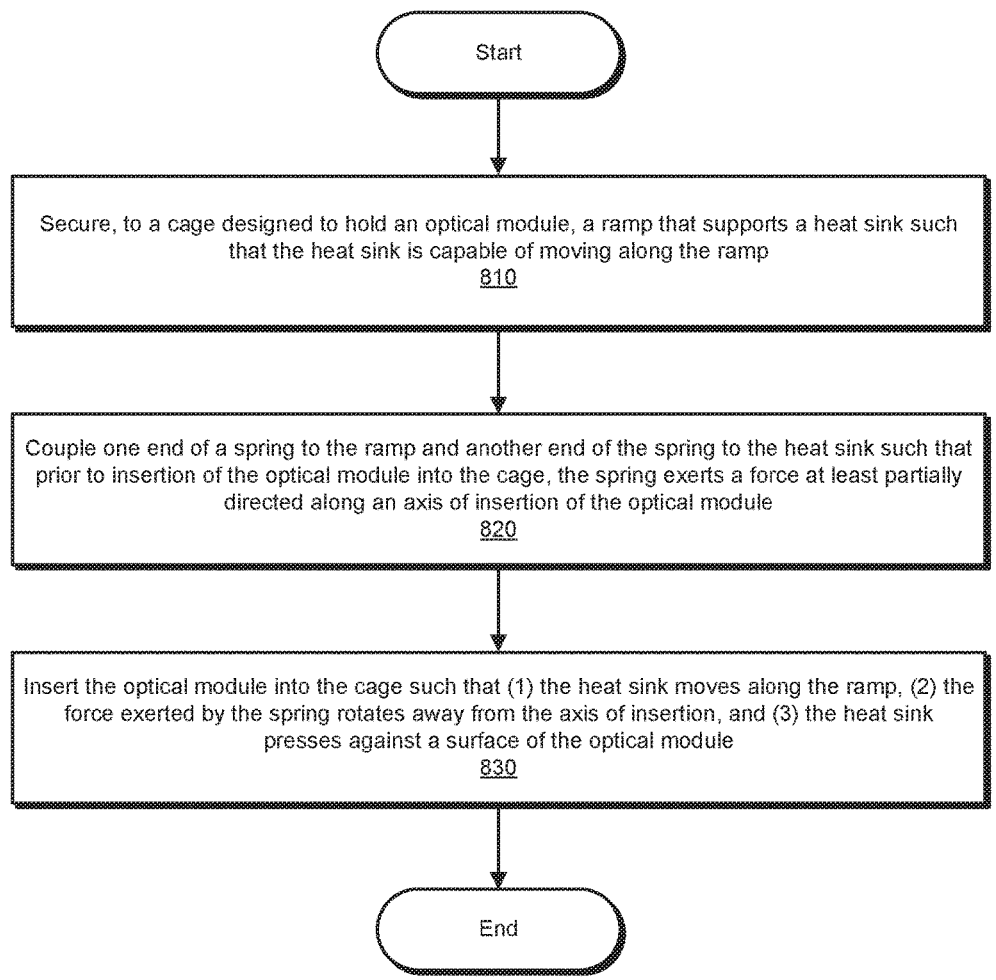
FIG. 8 is a flow diagram of an exemplary method for improving the thermal conduction of heat sinks.

FIG. 8 is a flow diagram of an exemplary method 800 for increasing the thermal conduction of heat sinks. Method 800 may include the step of securing, to a cage designed to hold an optical module, a ramp that supports a heat sink such that the heat sink is capable of moving along the ramp (810). This securing step may be performed in a variety of ways. In one example, an optical module manufacturer may manufacture and/or assemble the components of apparatus 100. While manufacturing apparatus 100, the manufacturer may position and/or support heat sink 108 within ramp 106 such that at least one end of heat sink 108 is free (i.e., not attached to any other component of apparatus 100). In this way, the manufacturer may ensure that heat sink 108 is capable of moving along ramp 106 (e.g., via one or more pins extending from at least one side of heat sink 108).

In some examples, the manufacturer may position heat sink 108 within ramp 106 after securing ramp 106 to cage 102. When positioning heat sink 108 within ramp 106, the manufacturer may ensure that blade 304 of heat sink 108 extends into cage 102. As such, force against blade 304 may cause heat sink 108 to move along ramp 106.

Returning to FIG. 8, method 800 may also include the step of coupling one end of a spring to the ramp and another end of the spring to the heat sink such that prior to insertion of the optical module into the cage, the spring exerts a force at least partially directed along an axis of insertion of the optical module (820). This coupling step may be performed in a variety of ways. In one example, an optical module manufacturer may couple spring end 112 of spring 110 to ramp 106 and spring end 114 of spring 110 to heat sink 108. In this configuration, spring 110 may exert a force on heat sink 108 and/or ramp 106. In some embodiments, the manufacturer may position the ends of spring 110 such that the force exerted by spring 110 is at least partially directed along axis of insertion 116. In this way, the manufacturer may ensure that spring 110 does not press heat sink 108 against cage 102 prior to the insertion of optical module 104.

Finally, method 800 may include the step of inserting the optical module into the cage such that (1) the heat sink moves along the ramp, (2) the force exerted by the spring rotates away from the axis of insertion, and (3) the heat sink presses against a surface of the optical module. This inserting step may be performed in a variety of ways. In one example, a user may perform this step after an optical module manufacturer has manufactured apparatus 100.

For example, in order to operate optical module 104, the user may insert optical module 104 into cage 102. During this insertion, optical module 104 may contact and/or press against blade 304. The force of optical module 104 against blade 304 may produce movement of heat sink 108 along ramp 106. As heat sink 108 moves along ramp 106, spring end 114 (attached to heat sink 108) may rotate and/or move towards spring end 112 (attached to ramp 106). As a result, the force exerted by spring 110 may change in both magnitude and direction. Specifically, the force may increase in magnitude and also rotate away from axis of insertion 116. Such a change in the force exerted by spring 110 may press heat sink 108 securely against optical module 104, thereby enabling efficient heat transfer between optical module 104 and heat sink 108. In addition, this force may prevent optical module 104 from disengaging (e.g., falling out of) cage 102 until the user manually removes optical module 104.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
a cage designed to hold an optical module;
a ramp that is secured to the cage and supports a heat sink such that the heat sink is capable of moving along the ramp; and
at least one spring having one end coupled to the ramp and another end coupled to the heat sink, wherein:
prior to insertion of the optical module into the cage, the spring exerts a force at least partially directed along an axis of insertion of the optical module; and
insertion of the optical module into the cage moves the heat sink along the ramp such that the force exerted by the spring:
rotates away from the axis of insertion; and
presses the heat sink against a surface of the optical module.

2. The apparatus of claim 1, wherein the heat sink moves along the ramp via at least one pin that extends from at least one side of the heat sink.

3. The apparatus of claim 1, wherein the spring comprises a torsion spring.

4. The apparatus of claim 1, wherein the movement of the heat sink along the ramp causes movement of the end of the spring coupled to the heat sink.

5. The apparatus of claim 1, wherein:
the heat sink comprises a blade that extends into an opening within the cage; and
the optical module makes contact with the blade when the optical module is partially inserted into the cage.

6. The apparatus of claim 5, wherein after the optical module makes contact with the blade, the optical module and the heat sink move together until the optical module is fully inserted into the cage.

7. The apparatus of claim 6, wherein while the optical module is being inserted into the cage, the surface of the optical module makes contact with a pedestal of the heat sink via the opening within the cage, the pedestal comprising a thermal interface material that transfers heat away from the optical module.

8. The apparatus of claim 7, wherein the optical module and the heat sink move together at least in part via friction between the optical module and the pedestal.

9. The apparatus of claim 1, wherein insertion of the optical module into the cage increases the force exerted by the spring.

10. The apparatus of claim 1:
wherein the heat sink comprises:
- a first section that interacts with the ramp; and
- a second section that dissipates heat transferred away from the optical module; and further comprising a heat pipe that connects the first section and the second section.

11. The apparatus of claim 10, wherein the heat pipe comprises:
- a flexible metal bellows; and
- a flexible wick system internal to the flexible metal bellows.

12. The apparatus of claim 11, wherein:
- the second section of the heat sink is secured to an enclosure that houses the cage; and
- the flexible metal bellows contracts and expands with movement of the first section of the heat sink.

13. A heat transfer system comprising:
- a cage designed to hold an optical module;
- a ramp that is secured to the cage and supports a heat sink such that the heat sink is capable of moving along the ramp; and
- at least one spring having one end coupled to the ramp and another end coupled to the heat sink, wherein:
  - prior to insertion of the optical module into the cage, the spring exerts a force at least partially directed along an axis of insertion of the optical module; and
  - insertion of the optical module into the cage moves the heat sink along the ramp such that the force exerted by the spring:
    - rotates away from the axis of insertion; and
    - presses the heat sink against a surface of the optical module.

14. The heat transfer system of claim 13, wherein the heat sink moves along the ramp via at least one pin that extends from at least one side of the heat sink.

15. The heat transfer system of claim 13, wherein the spring comprises a torsion spring.

16. The heat transfer system of claim 13, wherein the movement of the heat sink along the ramp causes movement of the end of the spring coupled to the heat sink.

17. The heat transfer system of claim 13, wherein:
- the heat sink comprises a blade that extends into an opening within the cage; and
- the optical module makes contact with the blade when the optical module is partially inserted into the cage.

18. The heat transfer system of claim 17, wherein after the optical module makes contact with the blade, the optical module and the heat sink move together until the optical module is fully inserted into the cage.

19. The heat transfer system of claim 13:
wherein the heat sink comprises:
- a first section that interacts with the ramp; and
- a second section that dissipates heat transferred away from the optical module; and further comprising a heat pipe that connects the first section and the second section.

20. A method comprising:
- securing, to a cage designed to hold an optical module, a ramp that supports a heat sink such that the heat sink is capable of moving along the ramp;
- coupling one end of a spring to the ramp and another end of the spring to the heat sink such that prior to insertion of the optical module into the cage, the spring exerts a force at least partially directed along an axis of insertion of the optical module; and
- inserting the optical module into the cage such that:
  - the heat sink moves along the ramp;
  - the force exerted by the spring rotates away from the axis of insertion; and
  - the heat sink presses against a surface of the optical module.

* * * * *